United States Patent
Suga et al.

(10) Patent No.: US 11,404,237 B2
(45) Date of Patent: Aug. 2, 2022

(54) CHARGED PARTICLE BEAM DEVICE

(71) Applicant: Hitachi High-Tech Corporation, Tokyo (JP)

(72) Inventors: Anoru Suga, Tokyo (JP); Shuhei Yabu, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/287,249

(22) PCT Filed: Feb. 22, 2019

(86) PCT No.: PCT/JP2019/006691
§ 371 (c)(1),
(2) Date: Apr. 21, 2021

(87) PCT Pub. No.: WO2020/170408
PCT Pub. Date: Aug. 27, 2020

(65) Prior Publication Data
US 2021/0384003 A1    Dec. 9, 2021

(51) Int. Cl.
*H01J 37/073* (2006.01)
*H01J 37/22* (2006.01)
(Continued)

(52) U.S. Cl.
CPC ......... *H01J 37/073* (2013.01); *H01J 37/222* (2013.01); *H01J 37/244* (2013.01); *H01J 37/28* (2013.01);
(Continued)

(58) Field of Classification Search
CPC ...... H01J 37/073; H01J 37/222; H01J 37/244; H01J 37/28; H01J 2237/2448;
(Continued)

(56) References Cited

U.S. PATENT DOCUMENTS

| 9,633,815 B1 | 4/2017 | Adamec et al. | |
| 2008/0073556 A1* | 3/2008 | Kawana | H01J 49/10 250/423 R |

(Continued)

FOREIGN PATENT DOCUMENTS

| JP | 2000-164164 A | 6/2000 |
| JP | 2003-36807 A | 2/2003 |

(Continued)

OTHER PUBLICATIONS

International Search Report (PCT/ISA/210) issued in PCT Application No. PCT/JP2019/006691 dated May 7, 2019 with English translation (four (4) pages).

(Continued)

*Primary Examiner* — David A Vanore
(74) *Attorney, Agent, or Firm* — Crowell & Moring LLP

(57) ABSTRACT

An object of the present invention is to reduce the possibility that a filament is broken during observation and a re-measurement is required, to reduce the running cost of an apparatus, and to improve the operating efficiency of the apparatus. The charged particle beam apparatus according to the present invention calculates an imaging time required to generate an observation image of a sample and estimates a remaining usable time of the filament, and when the imaging time is longer than the remaining usable time, presents the fact (see FIG. 3).

8 Claims, 5 Drawing Sheets

(51) Int. Cl.
*H01J 37/244* (2006.01)
*H01J 37/28* (2006.01)

(52) U.S. Cl.
CPC ............... *H01J 2237/2448* (2013.01); *H01J 2237/24592* (2013.01)

(58) Field of Classification Search
CPC ....... H01J 2237/24592; H01J 2237/065; H01J 37/265; H01J 37/06
See application file for complete search history.

(56) References Cited

U.S. PATENT DOCUMENTS

2019/0147578 A1* 5/2019 Hellestam ............... H01J 3/028
 250/395
2021/0384003 A1* 12/2021 Suga ..................... H01J 37/073

FOREIGN PATENT DOCUMENTS

| JP | 2007-227255 A | 9/2007 |
| JP | 2007-250425 A | 9/2007 |
| JP | 2009-245725 A | 10/2009 |
| JP | 2018-173372 A | 11/2018 |
| WO | WO 2017/179137 A1 | 10/2017 |
| WO | WO 2018/217167 A1 | 11/2018 |

OTHER PUBLICATIONS

Japanese-language Written Opinion (PCT/ISA/237) issued in PCT Application No. PCT/JP2019/006691 dated May 7, 2019 (four (4) pages).

* cited by examiner

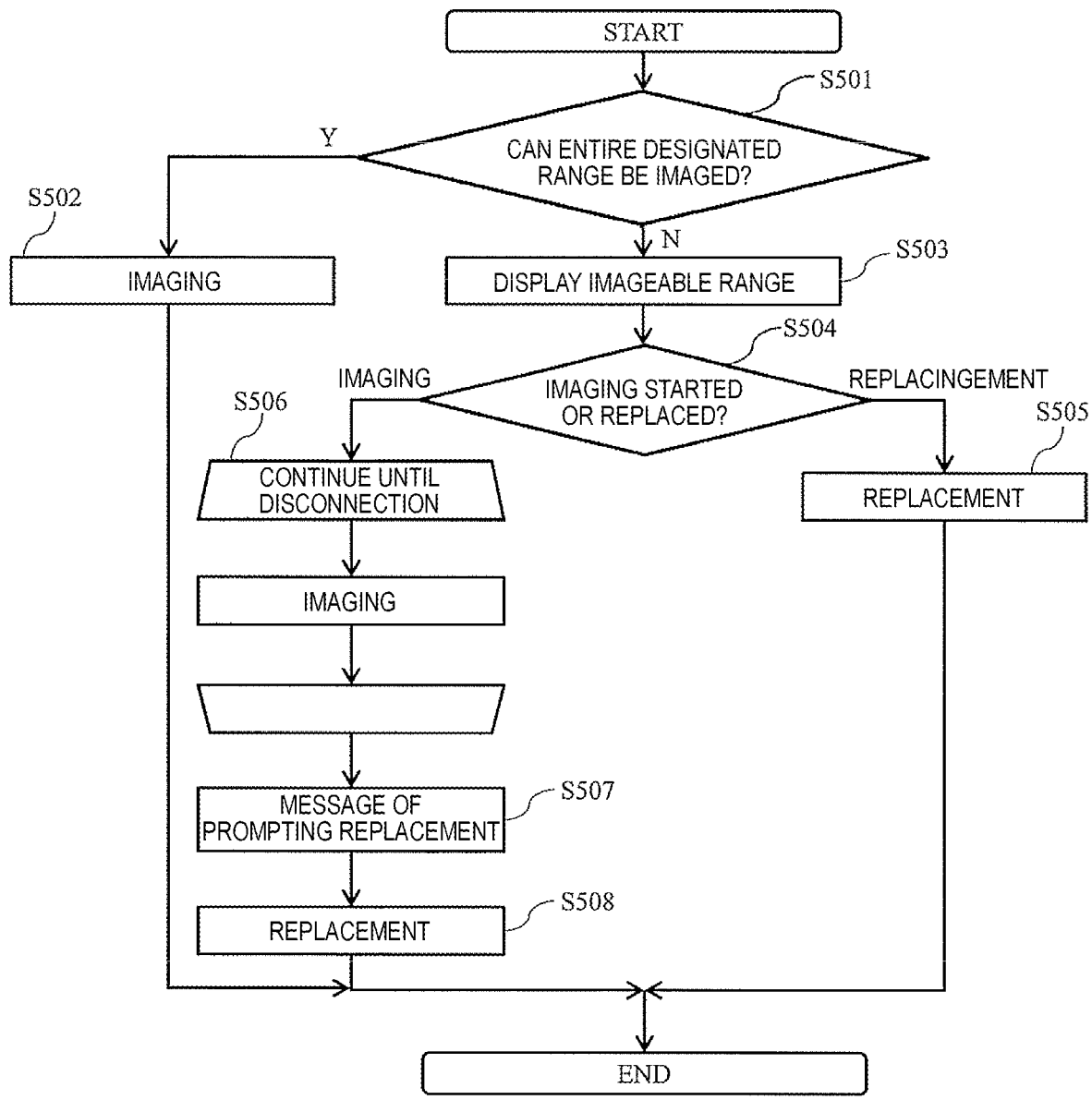

CHARGED PARTICLE BEAM DEVICE

TECHNICAL FIELD

The present invention relates to a charged particle beam apparatus that irradiates a sample with a charged particle beam.

BACKGROUND ART

A filament is used as a charged particle beam source of a charged particle beam apparatus. For example, when the charged particle beam source is electrons, a voltage is applied to both ends of the filament, and thus, thermal electrons generated when the filament is heated are used. An electron gun using this principle is referred to as a thermal-electron gun. In this technique, since the filament is used at a high temperature, the filament is worn out due to sublimation. When the wear becomes severe, the filament is disconnected. The filament lifetime of the thermal-electron gun is generally as short as about 50 to 100 hours, and it can be understood that the filament is frequently broken when it is considered that the filament lifetime of a Schottky type electron gun is 1 to 2 years. Therefore, when the filament is continuously operated during long-time observation/analysis or the like, there is a high risk that the filament is broken during observation. When the filament is disconnected during long-time imaging, it is necessary to search a field of view of an observation sample and adjust the focus again to perform imaging again, and thus, the utilization efficiency of the apparatus deteriorates. The filament can be replaced with a new filament before the observation so that the filament is not broken during the imaging, but more filaments are used, which causes an increase in the running cost.

The following PTL 1 discloses a technique to prevent an unexpected downtime due to the lifetime of the electron source in an electron beam device using a Schottky electron source and to replace the electron source or the electron gun at an optimum time. In the same publication, the allowable use time of the electron source is set in advance, and the remaining lifetime is calculated based on the allowable use time and the integrated use time.

CITATION LIST

Patent Literature

PTL 1: JP A 2000-164164

SUMMARY OF INVENTION

Technical Problem

In PTL 1, the allowable use time and the integrated use time are compared. However, since the allowable use time is set by the user, the allowable use time may not always accurately reflect the life of the filament. In addition, since the allowable use time may not always reflect the observation time, there is a possibility that the filament may be broken during the observation.

The present invention is made in consideration of the above-mentioned problems and objects thereof are to reduce the possibility that a filament is broken during observation and a re-measurement is required, to reduce the running cost of the apparatus, and to improve the operating efficiency of the apparatus.

Solution to Problem

The charged particle beam apparatus according to the present invention calculates an imaging time required to generate an observation image of a sample, estimates the remaining usable time of a filament, and when the imaging time is longer than the remaining usable time, presents that fact.

Advantageous Effects of Invention

According to a charged particle beam apparatus according to the present invention, the possibility of breakage of a filament during observation can be suppressed. Therefore, unexpected downtime due to the lifetime of the charged particle source is prevented, and an electron source or an electron gun can be replaced at an optimal time. Therefore, the running cost of the apparatus can be reduced, and the operating efficiency of the apparatus can be improved.

BRIEF DESCRIPTION OF DRAWINGS

FIG. 5 is a flowchart for illustrating an operation procedure of the scanning electron microscope 100.

DESCRIPTION OF EMBODIMENTS

First Embodiment

Figure 1:
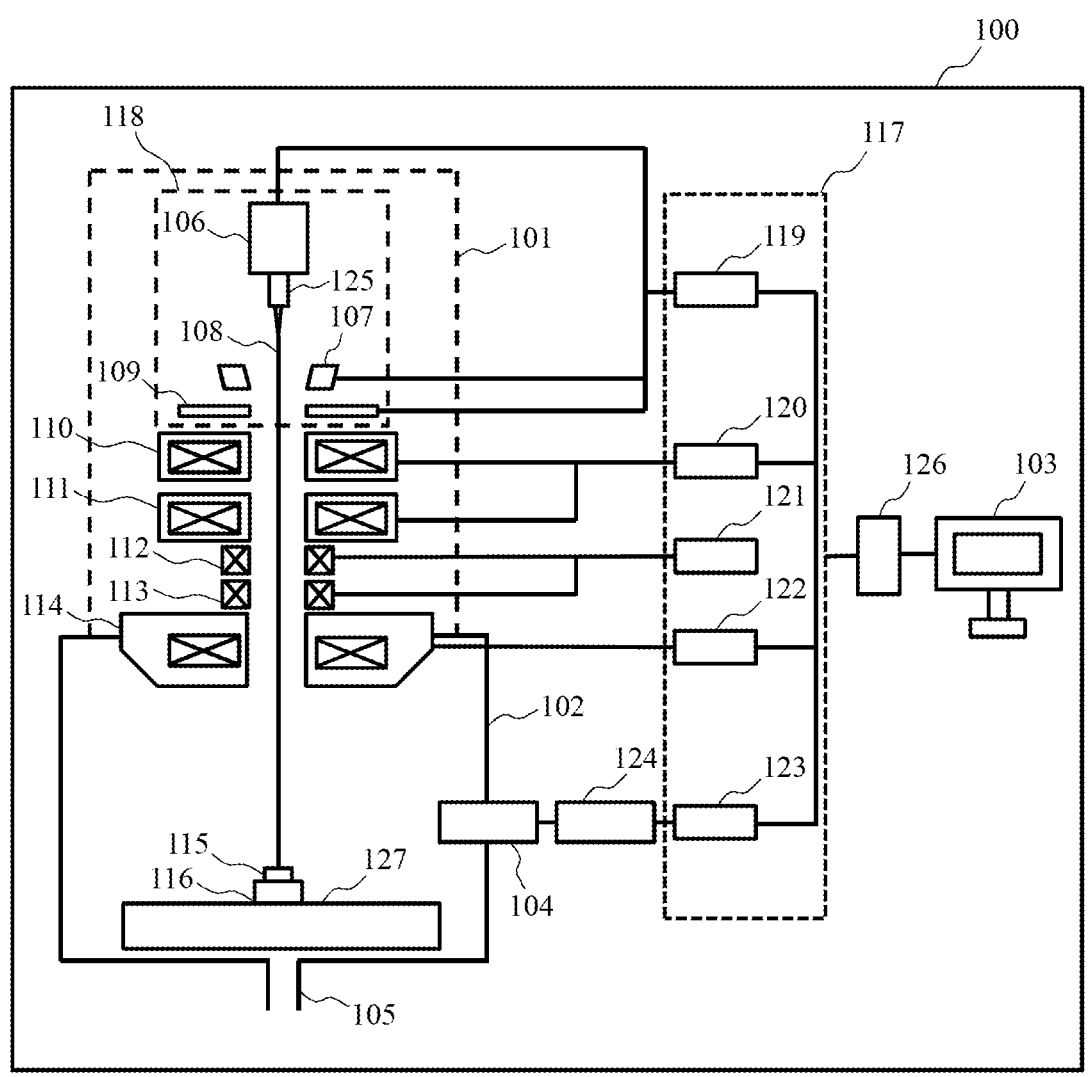
FIG. 1 is a configuration diagram of a scanning electron microscope 100 according to a first embodiment.

FIG. 1 is a configuration diagram of a scanning electron microscope 100 according to a first embodiment of the present invention. The scanning electron microscope 100 includes a lens barrel unit 101, a sample chamber 102, a control unit 117, a computer 126, and a display device 103. The lens barrel unit 101 includes a cathode 106, a Wehnelt 107, a filament 125, an anode 109, a first focusing lens 110, a second focusing lens 111, an upper deflection coil 112, a lower deflection coil 113, and an objective lens 114. The sample chamber 102 is maintained at a vacuum degree of $10^{-3}$ to $10^{-4}$ Pa by a vacuum pump 105. The sample chamber 102 includes a sample 115, a sample stand 116, a sample stage 127, and a detector 104.

The control unit 117 is a functional unit that controls each unit included in the scanning electron microscope 100 and includes a high voltage control circuit 119, a focusing lens control circuit 120, a deflection control circuit 121, an objective lens control circuit 122, and a signal processing circuit 123. The high voltage control circuit 119 controls a voltage applied to an electron gun 118. The focusing lens control circuit 120 controls the first focusing lens 110 and the second focusing lens 111. The deflection control circuit 121 controls the upper deflection coil 112 and the lower deflection coil 113. The objective lens control circuit 122 controls the objective lens 114.

The high voltage control circuit 119 applies a desired voltage to the filament 125, the Wehnelt 107, and the anode 109 in the electron gun 118. A primary electron beam 108 is emitted from the filament 125 by the applied voltage. The electron gun 118 can be configured as a thermal-electron gun that emits the primary electron beam 108 by using thermal electrons generated by, for example, heating the filament 125.

The primary electron beam 108 is focused by the first focusing lens 110 and the second focusing lens 111 and, after that, is focused on the sample 115 by the objective lens 114. The primary electron beam 108 focused on the sample 115 simultaneously scans the irradiation position on the sample 115 due to the upper deflection coil 112 and the lower deflection coil 113. According to the irradiation of the primary electron beam 108, signal electrons determined by the shape, composition and the like of the sample 115 are emitted from the sample 115. The detector 104 detects the signal electrons. The detected signal electrons are amplified by an amplifier 124 and output to the computer 126 through the signal processing circuit 123. The computer 126 generates an observation image of the sample 115 using the detection result of the signal electrons and the display device 103 displays the observation image.

In recent years, there has been a tendency to acquire images in a wide area with a high resolution due to an increase in the storage area of the computer 126 and an increase in processing capacity. Such a using method is employed for observing a material or structure having an order of several tens of nm to several tens of μm within the sample 115 in a wide area of about several mm to several tens of mm or for analyzing minute materials. On the other hand, the scanning electron microscope 100 performs scanning with the primary electron beam 108 to acquire signal information for each pixel. In order to acquire an observation image having a certain S/N level, thus, the scanning time for one pixel cannot be shortened even in the case of acquiring an image having a wide area with a high resolution. Generally, the scanning time per pixel is about several tens of ns to several hundreds of μs. For example, if a 10 nm square area per pixel is acquired with a scanning time of 10 μs and the observation image size is 1 mm square, the time required to capture the entire observation image becomes 1 mm×1 mm/(10 nm×10 nm)×10 μs=100,000 s=27.8 h, and a very long time is required.

Generally, as a method of imaging such a wide area, there are a method of increasing the number of pixels included in one image, a method of capturing a plurality of images while moving the sample stage 127 little by little and then combining the images, and the like. The former method shortens the scanning interval of the primary electron beam 108 and widens the imaging region. While a beautiful seamless image can be obtained by this method, the maximum number of pixels is limited by the memory of the computer, which makes the image size limited. For this reason, generally, as in the latter method, adopted is a method of adjusting the number of pixels imaged at one time and a range of the field of view to an observation object, capturing a plurality of images while moving the sample stage 127 and then stitching the images. When the user sets the observation area, observation conditions, or the like in advance, the designated observation area can be automatically imaged. Therefore, a desired observation image can be automatically obtained for a long time without monitoring of the imaging process by a person. Of course, both methods can also be combined.

In the case of observing or analyzing a wide area, in some cases, it may be necessary to allow the scanning electron microscope 100 to run continuously for a long time. On the other hand, the filament 125 has a limited lifetime and observation cannot be continued if the filament 125 reaches the lifetime. The lifetime of the filament 125 varies with the type of the electron gun 118, and thus, in the case of a tungsten filament, it is said that the lifetime is generally about 50 to 100 hours although it depends on the conditions. The lifetime of the filament 125 needs to be longer than the observation time. If the lifetime of the filament 125 is shorter than the observation time, the filament 125 is broken during the observation, and the user needs to replace the filament 125 and perform the observation again or needs to restart the observation from the place where the observation is stopped.

In order to avoid such a situation, the filament may be replaced with a new filament in advance at the time of observing for a long time, but more filaments are used, which causes an increase in the running cost. The first embodiment aims to improve the operating rate of the apparatus and the running cost of the apparatus by allowing the user to determine whether or not to continue the observation according to the state of the filament 125 and the set observation conditions, in such a situation.

Figure 2:
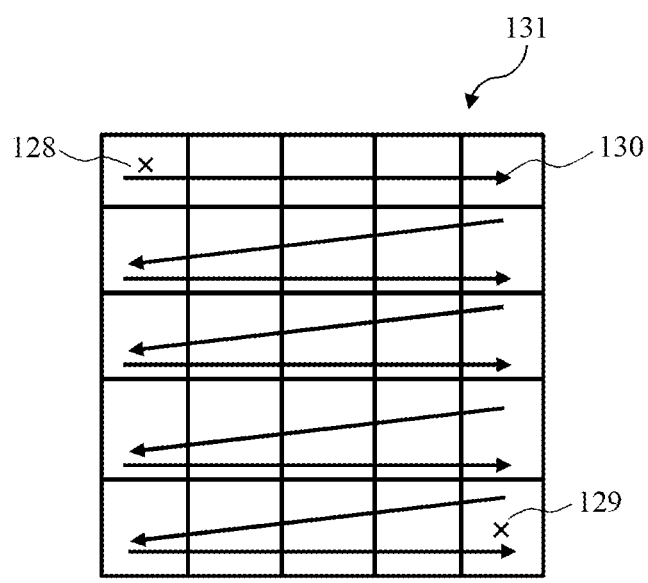
FIG. 2 is an example of a method of capturing an observation image in a wide area.

FIG. 2 is an example of a method of capturing the observation image in a wide area. The user designates a measurement range 131 and scanning with the primary electron beam 108 is performed from the left to the right in an imaging direction 130 starting from a measurement start position 128. When the scanning position reaches the right end of the measurement range 131, the scanning position is moved to the one lower pixel line. The above-mentioned procedure is repeated up to the measurement end position 129.

Figure 3:
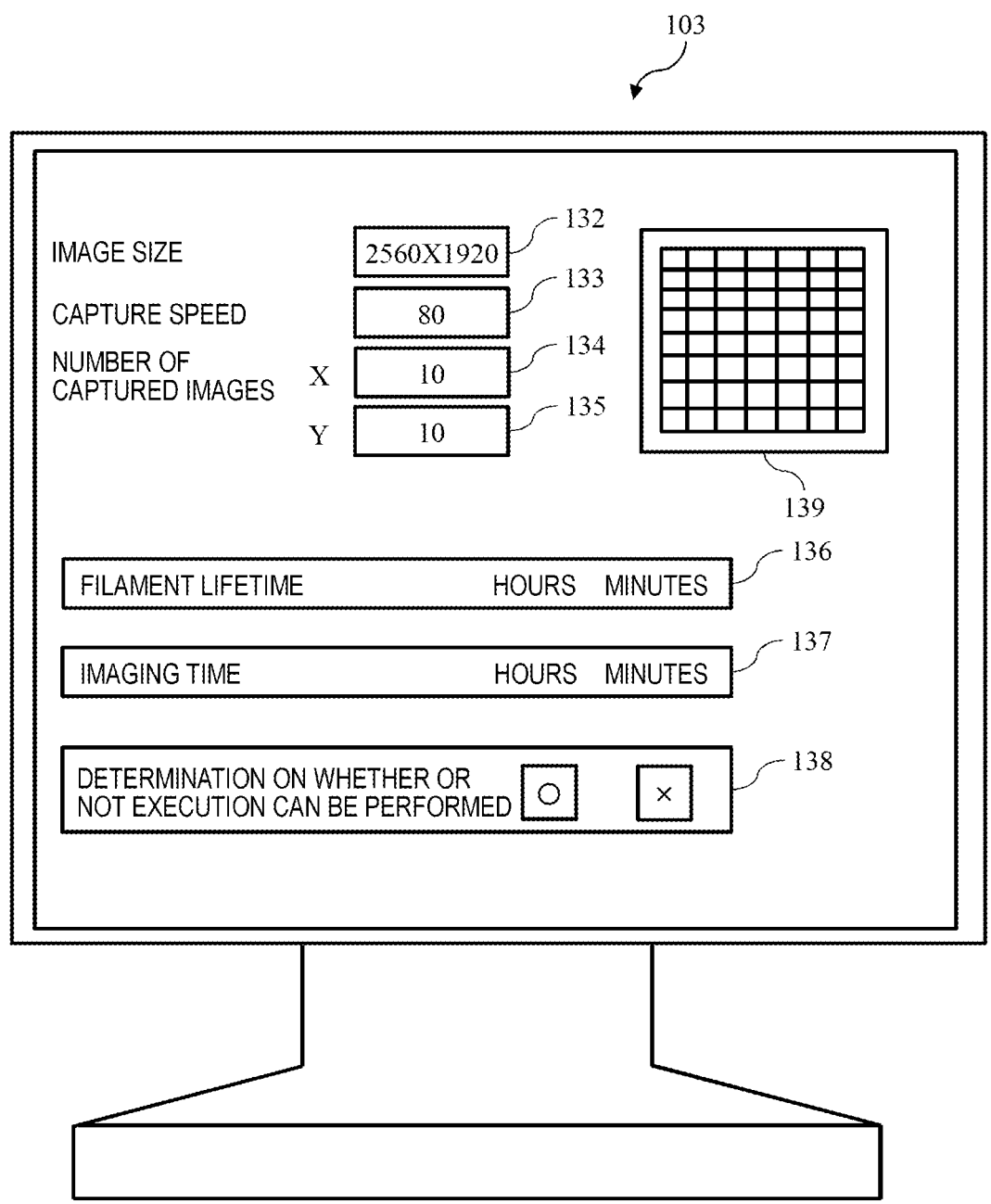
FIG. 3 is an example of a GUI displayed by a display device 103.

FIG. 3 is an example of a graphical user interface (GUI) displayed by the display device 103. The user inputs an image size 132 of the observation image and a capture speed 133. When the plurality of observation images are captured and stitched together, the number of captured images 134 in the X direction and the number of captured images 135 in the Y direction are designated. When only one observation image is captured, only one image needs to be used for both XY. These values are selected from the options input or determined by the user according to the desired observation conditions and imaging range.

The captured image 139 is an image of the sample 115 imaged in advance. The user designates a range to be imaged by the scanning electron microscope 100 on the captured image 139. As long as the user can designate the imaging range, the captured image 139 may be an optically captured image or may be an image of a scanning electron microscope. An observation range can be designated by (a) the user enclosing the desired imaging range with a figure, (b) the user designating the measurement start position 128 and the measurement end position 129, and determining the imaging range from the coordinates, or the like. If there is no captured image 139, the user may designate the measurement start position 128 and the measurement end position 129 by moving the sample stage 127 while displaying the observation image acquired by the scanning electron microscope 100 on the GUI. A plurality of imaging ranges may be designated.

As the filament lifetime 136, the result of the lifetime (the remaining time while the filament can be used normally) of the filament 125 estimated by the computer 126 is displayed. As the imaging time 137, the result calculated by the computer 126 as the time required to acquire the observation image of the sample 115 according to the parameters designated on the GUI is displayed. The determination result 138 indicates the result determined by the computer 126 according to the flowchart described later on whether or not the entire captured image can be acquired.

Figure 4A:
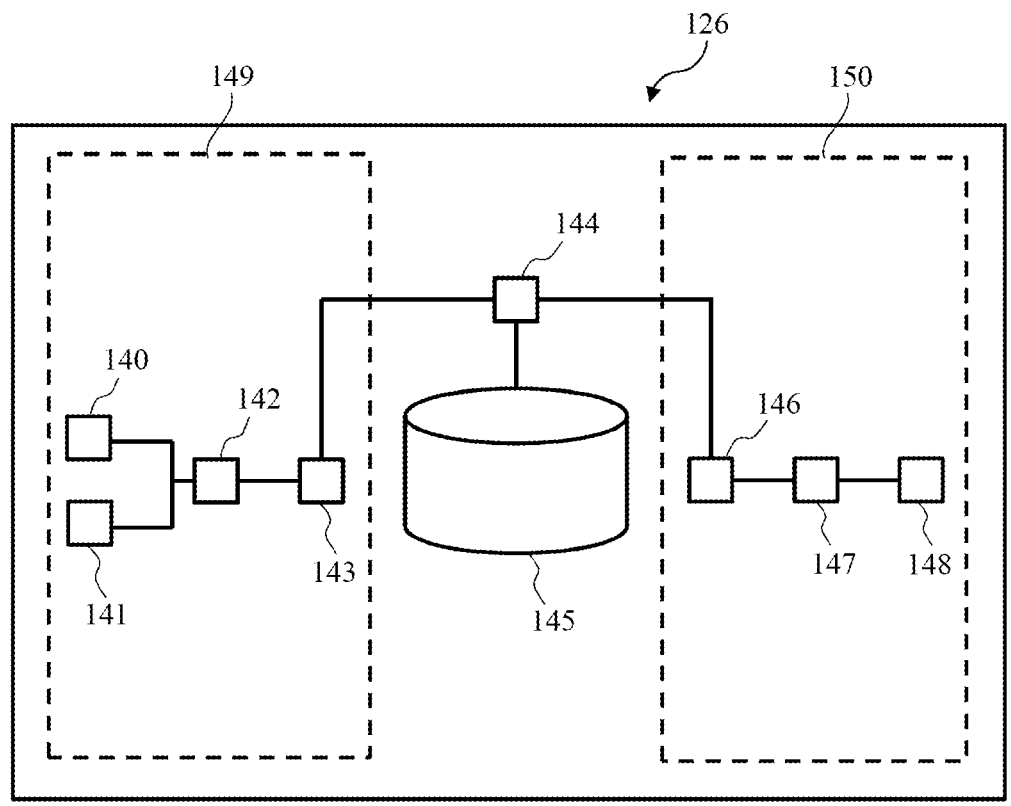
FIG. 4A is a functional block diagram illustrating a configuration of a computer 126.

FIG. 4A is a functional block diagram illustrating the configuration of the computer 126. The computer 126 includes a comparing unit 144, a filament lifetime estimating unit 149, an imaging time calculating unit 150, and a storage unit 145. The comparing unit 144, the filament lifetime estimating unit 149, and the imaging time calculating unit 150 can be configured by using hardware such as a circuit device with the function implemented or can be configured by allowing an arithmetic operation device to execute software with the function implemented. The storage unit 145 can be configured with a storage device such as a hard disk. The operation of the comparing unit 144 will be described later.

The filament lifetime estimating unit 149 includes a timer 140, a current reading unit 141, an energization time recording unit 142, and a lifetime calculating unit 143. The timer 140 counts the time when the filament 125 is energized. The current reading unit 141 reads the current value flowing through the filament 125 from, for example, a current meter (not illustrated). The energization recording unit 142 integrates the energization time counted by the timer 140 and stores the integrated energization time in the storage unit 145. The lifetime calculating unit 143 calculates the lifetime of the filament 125 by the method described later. The calculation result is used as an estimated lifetime of the filament 125.

The imaging time calculating unit 150 includes a time calculating unit 146, a time recording unit 147, and a setting reading unit 148. The setting reading unit 148 acquires the image size 132, the capture speed 133, the number of captured images 134, and the number of captured images 135 set by the user on the GUI described with reference to FIG. 3. The time recording unit 147 integrates the time when the scanning electron microscope 100 captures the observation image of the sample 115 and stores an integrated time thereof in the storage unit 145. The time calculating unit 146 calculates the time required to capture the observation image of the sample 115 by the method described later.

(Method 1 of Calculating Lifetime of Filament 125)

A total lifetime from the time when the filament 125 starts to be used until the filament cannot be used normally is empirically obtained in advance, and the total lifetime is stored in the storage unit 145. The energization time recording unit 142 stores the integrated energization time after the filament 125 is replaced with a new one in the storage unit 145. The lifetime calculating unit 143 calculates the remaining usable time of the filament 125 by obtaining a difference between the lifetime stored in the storage unit 145 and the integrated energization time.

(Method 2 of Calculating Lifetime of Filament 125)

Figure 4B:
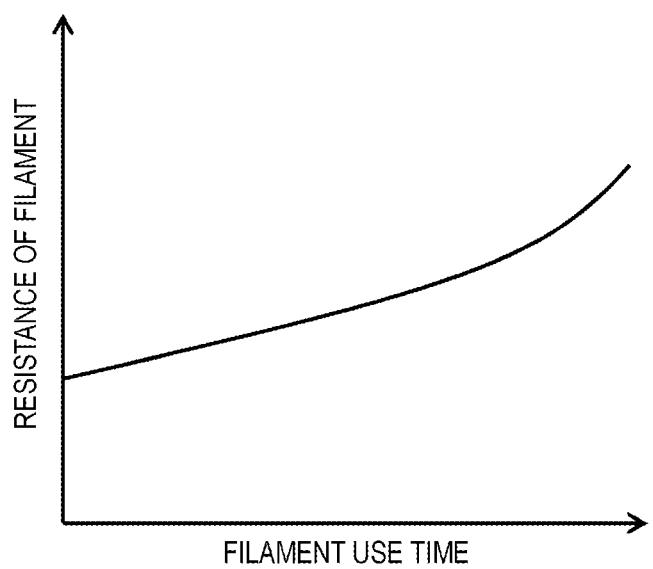
FIG. 4B is a graph illustrating changes in electrical resistance of a filament 125 over time.

FIG. 4B is a graph illustrating changes in electrical resistance of the filament 125 over time. Since the filament 125 is used at a high temperature and sublimated as the use time is accumulated, the thickness of the filament 125 is gradually changed. Therefore, the electrical resistance of the filament 125 changes over time. Data representing the changes over time illustrated in FIG. 4B is stored in the storage unit 145 in advance. The lifetime calculating unit 143 acquires an electrical resistance value of the filament 125 and calculates the remaining usable time of the filament 125 by referring to the data of FIG. 4B by using the resistance value.

(Method 3 of Calculating Lifetime of Filament 125)

The lifetime can be calculated by combining the above-mentioned methods. For example, it is conceivable to calculate the lifetime by using both methods and to calculate the lifetime by weighting and adding each lifetime. Both methods may be combined with other appropriate methods.

The time calculating unit 146 can calculate the time required to capture the observation image according to the following equation: imaging time=number of captured images×(scanning time+stage moving time+waiting time). The scanning time is the number of pixels of observation image×capture speed×number of integrated images. The number of pixels can be obtained from the image size 132. The capture speed is the irradiation time of the charged particle beam required to image one pixel. The capture speed can be obtained from the capture speed 133 on the GUI. For the purpose of improving the SN ratio, the same location on the observation image may be imaged several times, and the images obtained by each imaging may be superimposed. The number of superimposed images at this time is referred to as the number of integrated images. Since, for example, the stage moving amount for one field of view can be known according to how many divisions the imaging region is divided into, the time required to move by the moving amount can be used as the stage moving time.

FIG. 5 is a flowchart illustrating an operation procedure of the scanning electron microscope 100. Hereinafter, each step of FIG. 5 is described.

(FIG. 5: Steps S501 to S502)

The filament lifetime estimating unit 149 calculates an estimated lifetime $T_{FIL}$ of the filament and displays the estimated lifetime $T_{FIL}$ on the filament lifetime 136. The imaging time calculating unit 150 calculates an imaging time $T_{CAPT}$ required to capture the observation image and displays the imaging time $T_{CAPT}$ on the imaging time 137. The user or the comparing unit 144 compares $T_{FIL}$ and $T_{CAPT}$ to determine whether or not the entire imaging range can be imaged (S501). When the comparing unit 144 performs determination, the result is presented on the determination result 138. When the user performs determination, the result is input to the determination result 138. When the entire imaging range can be imaged, the imaging is performed (S502) and the flowchart ends. When the entire imaging range cannot be imaged, the process proceeds to step S503.

(FIG. 5: Step S501: Supplement)

For example, the following can be considered as determination criteria in the step. When $T_{FIL}>T_{CAPT}$, the process proceeds to step S502. When $T_{FIL}\approx T_{CAPT}$, the process proceeds to step S502 and an alert message is presented to the user. When $T_{FIL}<T_{CAPT}$, the process proceeds to step S503.

(FIG. 5: Step S502: Supplement)

When the process proceeds from S501 to S502, a message indicating that imaging is possible may be notified to the user on the GUI by characters, symbols, or the like.

(FIG. 5: Steps S503 to S505)

The computer 126 prompts the user to designate whether to image until the filament 125 is broken or to start the imaging after replacing the filament 125 with a new one on the GUI (S503). When the user selects the replacement (S504: imaging), the replacement work is performed (S505) and the flowchart ends. When the user selects the imaging, the process proceeds to step S506.

(FIG. 5: Steps S506 to S508)

The scanning electron microscope 100 continues imaging until the filament 125 is disconnected (S506). When the filament 125 is disconnected, the computer 126 displays a message to prompt the replacement of the filament 125 on the GUI (S507). The user replaces the filament 125 (S508).

(FIG. 5: Step S506: Supplement)

When determining whether or not the filament 125 is disconnected, for example, the current value flowing through the filament 125 is monitored and it can be determined that the filament 125 is disconnected when the current value becomes less than a determination threshold value. The determination may be performed by other appropriate methods. The control unit 117 stops the imaging operation at the time when the filament 125 is disconnected.

First Embodiment: Summary

The scanning electron microscope 100 according to the first embodiment automatically determines whether or not the filament is broken during the long-time observation before the long-time observation is performed and notifies the fact to the user. Therefore, it is possible to reduce the effort required for re-measurement due to the breakage of the filament in the middle and to start imaging without a concern. In addition, since the user can see the lifetime of the filament and change the originally defined observation condition, thereby setting the condition in advance so that the imaging can be completed without breakage of the filament, it is possible to fully utilize the filament, to reduce the effort to replace the filament, and to reduce the running cost of the apparatus.

Second Embodiment

In the first embodiment, when the imaging time is equal to or longer than the remaining lifetime of the filament 125, the setting conditions that the imaging can be performed can be presented to the user on the GUI, in S503. In the second embodiment of the present invention, a specific example thereof will be presented.

For example, when the obtained filament lifetime $T_{FIL}$ is compared with the imaging time $T_{CAPT}$, and $T_{FIL} \approx T_{CAPT}$ or $T_{FIL} < T_{CAPT}$, there is a high possibility that the filament 125 is broken during the observation. At this time, similarly to the first embodiment, when an alert or the replacement of the filament is prompted, the filament 125 will be replaced even though the filament 125 can still be used for some time, and thus, an extra replacement cost is required for the user. Therefore, in the second embodiment of the present invention, the setting conditions that the imaging can be performed within a range of the estimated filament lifetime are presented on the GUI.

Specifically, for example, an observation range in which imaging can be performed within the estimated filament lifetime is presented to the user, and the user can set any location within the observation range. In addition to the observation range, the computer 126 presents a plurality of conditions in which the imaging can be performed within the filament lifetime while arbitrarily changing each of the parameters related to the imaging time, such as (a) the number of captured images in each XY direction, (b) the scanning speed, (c) the image size, and (d) the number of integrated images. At this time, the user may fix any of the parameters. In that case, the computer 126 presents the setting conditions that imaging can be performed while changing other parameters.

According to the second embodiment, since the user can use the maximum of the lifetime of the filament 125, the running cost required for the filament 125 can be reduced, and the effort to replace the filament 125 can be reduced.

Third Embodiment

The second embodiment has described the case where the setting conditions that the imaging can be performed within the filament lifetime are presented on the GUI when the filament lifetime is equal to or shorter than the imaging time. On the other hand, the filament lifetime can be obtained in advance regardless of each of the setting conditions. In addition, it is conceivable that each of the setting conditions required for the imaging has a certain range. Therefore, in the scanning electron microscope 100 according to the third embodiment of the present invention, before the user inputs the setting conditions, the maximum value of each of the conditions is calculated by using the filament lifetime.

The time required for automatic wide area observation can be roughly calculated according to the number of captured images, the scanning speed, the number of integrated images, the number of pixels, and the like (by multiplying these parameters). Therefore, for example, when it is desired to obtain the maximum number of captured images, the maximum number of captured images that can be captured within the current filament lifetime can be calculated by inserting the settable minimum values for other parameters such as the scanning speed into the calculation equation. Other parameters can be calculated in this manner, and when a certain parameter has been set, each parameter is re-calculated by using the setting value. By doing so, even when the user has input each setting condition in any order, the condition capable of imaging within the filament lifetime can be automatically set. Therefore, the effort required for the user to set the conditions can be reduced as compared with the second embodiment.

Modification of the Present Invention

Although the scanning electron microscope 100 is exemplified in the above embodiments, the present invention can also be applied to other types of charged particle beam apparatuses. That is, as long as the charged particle beam apparatus uses the filament 125 as a charged particle beam source, a comparison result of the remaining lifetime of the filament 125 and the imaging time can be presented on the GUI by using the present invention.

REFERENCE SIGNS LIST

100: scanning electron microscope
101: lens barrel unit
102: sample chamber
103: display device
104: detector
105: vacuum pump
106: cathode
107: Wehnelt
108: electron beam
109: anode
110: first focusing lens
111: second focusing lens
112: upper deflection coil
113: lower deflection coil
114: objective lens
115: sample
116: sample stand
117: control unit
118: electron gun
119: high voltage control circuit
120: focusing lens control circuit
121: deflection control circuit
122: objective lens control circuit
123: signal processing circuit
124: amplifier 125: filament
126: computer
127: sample stage

The invention claimed is:

1. A charged particle beam apparatus that irradiates a sample with a charged particle beam, comprising:
   a charged particle beam source that performs irradiation with the charged particle beam from a filament;
   a detector that detects secondary charged particles generated by collision of the charged particle beam with the sample;
   a computer that generates an image of the sample by using the secondary charged particles detected by the detector, wherein
   the computer calculates an imaging time required to generate the image,
   the computer estimates a remaining time during which the filament can be used normally, and
   when the imaging time is longer than the remaining time, the computer outputs an alert indicating the fact.

2. The charged particle beam apparatus according to claim 1, wherein
   when the imaging time is longer than the remaining time, the computer presents an imageable range in which the image can be generated within a time during which the filament can be used normally, as the alert.

3. The charged particle beam apparatus according to claim 2, wherein
   the computer receives a designated input that designates at least one of a number of captured images, a pixel size of the image, an irradiation time of the charged particle beam required to capture the image for one pixel, and a number of integrated images by which the capturing of the image is performed to be superimposed on the same location of the image, as an imaging condition parameter,
   the computer calculates the imaging time according to the designation by the designated input, and
   when the imaging time is longer than the remaining time, the computer presents the imaging condition parameter which enables the imaging to be completed within the time during which the filament can be normally used as the imageable range.

4. The charged particle beam apparatus according to claim 3, wherein
   when the imaging time is longer than the remaining time, the computer presents a maximum value of each of the imaging condition parameters that can be set within a range in which imaging can be completed within the time during which the filament can be used normally, as the imageable range.

5. The charged particle beam apparatus according to claim 2, wherein
   the computer presents a user interface that prompts to select between acquiring the image until the imageable range is reached or replacing the filament when the imaging time is longer than the remaining time, and
   if the computer receives an instruction to select to acquire the image until the imageable range is reached through the user interface, the computer generates the image until the filament cannot be used normally.

6. The charged particle beam apparatus according to claim 5, wherein
   the computer acquires a measured value of a current flowing through the filament, and
   when the measured value of the current reaches less than a determination threshold value, the computer determines that the filament cannot be used normally and presents a message to prompt the replacement of the filament on the user interface.

7. The charged particle beam apparatus according to claim 1, further comprising:
   a storage unit that stores data describing a total usable time during which the filament can be used normally, wherein
   the computer calculates an integrated time when the filament is energized, and
   the computer estimates the remaining time by comparing the total usable time with the integrated time.

8. The charged particle beam apparatus according to claim 1, further comprising:
   a storage unit that stores data describing a relationship between an electrical resistance value of the filament and the usable time of the filament, wherein
   the computer calculates the electrical resistance value of the filament, and
   the computer estimates the remaining time by referring to the data by using the calculated electrical resistance value.

* * * * *